(12) United States Patent
Yang et al.

(10) Patent No.: US 8,198,962 B2
(45) Date of Patent: Jun. 12, 2012

(54) CARRIER FOR HIGH FREQUENCY SIGNALS HAVING CONDUCTING WIRES WITH ROUGHNESS PORTIONS AND A CARRIER LAYOUT METHOD

(75) Inventors: Chih-Ming Yang, Fongshan (TW);
Chien-Hao Huang, Banciao (TW);
Chao-Nan Tsai, Taipei (TW);
Ching-Feng Hsieh, Taipei (TW);
Chin-Ching Chang, Tucheng (TW);
Chun-Hsiung Tsai, Taipei (TW); Pi-Chi Chang, Jhonghe (TW); Chih-Wei Huang, Taichung (TW)

(73) Assignee: Askey Computer Corp., Taipei (TW)

(*) Notice: Subject to any disclaimer, the term of this patent is extended or adjusted under 35 U.S.C. 154(b) by 206 days.

(21) Appl. No.: 12/539,108

(22) Filed: Aug. 11, 2009

(65) Prior Publication Data

US 2010/0156572 A1 Jun. 24, 2010

(30) Foreign Application Priority Data

Dec. 19, 2008 (TW) .............................. 97149836 A

(51) Int. Cl.
*H01P 3/08* (2006.01)
(52) U.S. Cl. .......................................... 333/238; 333/33
(58) Field of Classification Search .................. 333/238, 333/246, 1, 33
See application file for complete search history.

(56) References Cited

U.S. PATENT DOCUMENTS

| | | | | | |
|---|---|---|---|---|---|
| 4,703,288 | A | * | 10/1987 | Frye et al. | 333/1 |
| 4,703,392 | A | * | 10/1987 | Robertson | 361/765 |
| 5,493,263 | A | * | 2/1996 | Tozawa | 333/238 |
| 6,075,423 | A | * | 6/2000 | Saunders | 333/33 |
| 6,914,502 | B2 | * | 7/2005 | Otsuka et al. | 333/238 |
| 2005/0116792 | A1 | * | 6/2005 | Moon et al. | 333/161 |

FOREIGN PATENT DOCUMENTS

| TW | I-229497 | 3/2005 |
|---|---|---|
| TW | I-246251 | 12/2005 |

* cited by examiner

*Primary Examiner* — Benny Lee
(74) *Attorney, Agent, or Firm* — Apex Juris, pllc; Tracy M. Heims

(57) ABSTRACT

A carrier for transmitting a high frequency signal and a carrier layout method thereof are provided. The carrier includes a substrate, conducting wires and reference planes both formed on the substrate. The carrier layout method includes defining impedance and thickness of the carrier according to the high frequency signal and defining layout parameters according to the impedance and the thickness. The layout parameters include a conducting layer formed on the conducting wires, a coplanar waveguide encompasses both the reference planes and the conducting wires as a part thereof, roughness portions formed on the conducting wires, recessed portions formed on the conducting wires, and the substrate being a high loss tangent substrate. The layout is performed according to the layout parameters defined thereabove, so as to increase loss of the high frequency signal in transmission.

18 Claims, 4 Drawing Sheets

CARRIER FOR HIGH FREQUENCY SIGNALS HAVING CONDUCTING WIRES WITH ROUGHNESS PORTIONS AND A CARRIER LAYOUT METHOD

CROSS-REFERENCE TO RELATED APPLICATIONS

This non-provisional application claims priority under 35 U.S.C. §119(a) on Patent Application No(s). 097149836 filed in Taiwan, R.O.C. on Dec. 19, 2008, the entire contents of which are hereby incorporated by reference.

FIELD OF THE INVENTION

The present invention relates to signal transmission, and more particularly, to a carrier for transmitting a high frequency signal and a carrier layout method thereof.

BACKGROUND OF THE INVENTION

Data transfer rate between communication products is ever-increasing. To ensure that transmission of a high frequency signal by a carrier is of high quality, the carrier, such as a print circuit board, or a cable such as flexible print circuit board/flat flexible cable (FPC/FFC), and Flex-rigid PCB, must have specified structure such as microstrip line, stripline and coplanar waveguide . . . etc so as for an electronic signal to be transmitted between conducting wires and to assure matching of characteristic impedance.

The communication products are usually equipped with flexible circuit boards, such as a flexible printed circuit board (flexible PCB) or a flex-rigid PCB, for functioning as a carrier on condition that a high speed signal's rise time, fall time, clock, jitter, and eye diagram are not compromised. A layout is formed on the carrier to function as a signal transmission structure, such as a Liquid Crystal Display (LCD) interface, a Charge-Coupled Device (CCD) interface, a Peripheral Component Interconnect (PCI), a Universal Serial Bus (USB) interface, a Serial Peripheral Interface (SPI) interface, an Inter-integrated Circuit (I2C) interface, an Audio Codec interface, a Local Area Network (LAN) interface, or an Advanced Technology Attachment (ATA) interface, for transmitting a high frequency signal to the carrier.

The foregoing signal transmission structure for transmitting a high speed signal to the carrier is likely to generate noise when coupled to another signals or transmit in a discontinuous structure, and thus the prior art is focused mostly on reduction of the harmonic of operation frequency. In general, the prior art solves the high frequency noise problem by increasing signal attenuation, avoid transmitting in a discontinuous structure, increase the spacing between signals and shielding the path of noise coupling and radiation. At present, suppression of signal attenuation is achieved in two ways: circuit compensation (or correction); and using materials which are unlikely to cause signal attenuation. The prior art is disclosed in Taiwan Patent No. I229497 and Taiwan Patent No. I246251, for example.

Considering the characteristics of circuits, the high-frequency part of a signal attenuates inevitably and readily; and the attenuation can be corrected by circuit design. For instance, a waveform correction circuit at the receiving end is configured to attenuate the low-frequency part of a signal received, so as to render signal attenuation consistent and thereby prevent waveform distortion. The otherwise reduced amplitude of the signal is restored by a signal amplifier at the back end. The input impedance of the correction circuit has to match characteristic impedance so as to prevent the waveform and signal from deteriorating.

For example, the prior art disclosed a low-pass filter disposed between a signal transmitting end and a signal receiving end for filtering out high frequency noise.

Nonetheless, a low-pass filter cannot operate without greatly increasing the area of a chip working and affect the requirement of signal quality in conjunction with the low-pass filter. Furthermore, under a variable process, a delay time of a delay unit is intractable and inflexible, for example. In addition, capacitors and resistors occupy a considerable part of the area of an integrated circuit and are indispensable to the low-pass filter. Hence, the presence of the low-pass filter inevitably requires a great increase in the area of the chip. Also, the delay time of the delay unit is not free from errors due to process variation, and nothing can be done to deal with the errors in the design phase. The disadvantageous outcome spares neither performance nor system stability. Last but not least, given the aforesaid design, the fixed, inflexible delay time is unlikely to work well with input signals at different frequencies, thereby compromising system stability.

In the situation where a substrate is made of a material unlikely to cause signal attenuation, loss of a high frequency signal can be suppressed by a low dielectric constant and small dielectric loss. However, such a substrate is rare and expensive. Hence, using the substrate for reducing the loss of a high frequency signal, punctual delivery and price should be evaluated carefully.

As explained above, drawbacks of the prior art abound. In this regard, an urgent issue involves developing a technology to improve carrier-based signal transmission and thereby overcome the drawbacks of the prior art.

SUMMARY OF THE INVENTION

In view of the aforesaid drawbacks of the prior art, it is an objective of the present invention to provide a carrier for transmitting a high frequency signal and a carrier layout method thereof so as to increase high frequency loss.

Another objective of the present invention is to provide a carrier for transmitting a high frequency signal and a carrier layout method thereof so as to enable flexible design.

To achieve the above and other objectives, the present invention provides a carrier for transmitting a high frequency signal, comprising a substrate, conducting wires and reference planes both formed on the substrate, and characterized by at least one of a conducting layer formed on the conducting wires, a coplanar waveguide encompasses both the reference planes and the conducting wiresas a part thereof, roughness portions formed on the conducting wires, recessed portions forming on the conducting wires, and the substrate being a high loss tangent substrate for increasing high frequency signal loss.

The present invention further provides a carrier layout method of transmitting a high frequency signal, comprising steps of: defining impedance and thickness of a carrier according to the high frequency signal in transmission; defining layout parameters according to the impedance and the thickness, wherein the carrier comprises a substrate, conducting wires and reference planes both formed on the substrate, and the layout parameters are characterized by at least one of forming a conducting layer on the conducting wires, forming a coplanar waveguide to encompass the reference planes and the conducting wires as a part thereof, forming roughness portions on the conducting wires, forming recessed portions on the conducting wires, and the substrate being a high loss tangent substrate; and performing layout according to the layout parameters defined, so as to increase loss of the high frequency signal in transmission.

Regarding the carrier and carrier layout method for transmitting a high frequency signal, the conducting layer is a layer of nickel or a layer of metal of low electrical conductivity. The roughness portions are formed on at least one side of the conducting wires.

The roughness portions satisfy equations $\sigma_c=\sigma/Kw^2$ and $Kw=1+\exp(-(s/2h)^{1.6})$, wherein electrical conductivity of roughness portion is denoted by $\sigma_c$, electrical conductivity is denoted by $\sigma$, skin effect parameter is denoted by Kw, roughness by h, and skin depth by s . . . Unit loss (R) of the signal in a circuit board satisfies equation $R=\sigma_c/(w\times s)$, wherein electrical conductivity of roughness portion is denoted by $\sigma$, trace width by w, and cross-sectional area by (w×s).

The substrate is an epoxy glass (FR4) substrate. The carrier is one selected from the group consisting of a circuit board, a bus line, and a flexible circuit board.

Regarding the carrier layout method, in the step of defining layout parameters according to the impedance and the thickness, board thickness required for layout design is evaluated when the carrier is a circuit board. The carrier layout method further comprises performing surface treatment so as to form the conducting layer on the conducting wires by electroplating or sputtering. The carrier layout method further comprises performing Electroless Nickel and Immersion Gold (ENIG) so as to increase thickness of the conducting layer.

To address high frequency noise, unlike the prior art that discloses using a low-pass filter to filter out high frequency noise, the present invention teaches increasing high frequency loss; and what is more, the present invention is more flexible in design than the prior art by teaching carrier-specific design.

BRIEF DESCRIPTION OF THE DRAWINGS

To enable persons skilled in the art to gain insight into the objectives, features, and effects of use of the present invention, the present invention is hereunder illustrated with a preferred embodiment in conjunction with the accompanying drawings, wherein.

DETAILED DESCRIPTION OF THE EMBODIMENT

Figure 1:
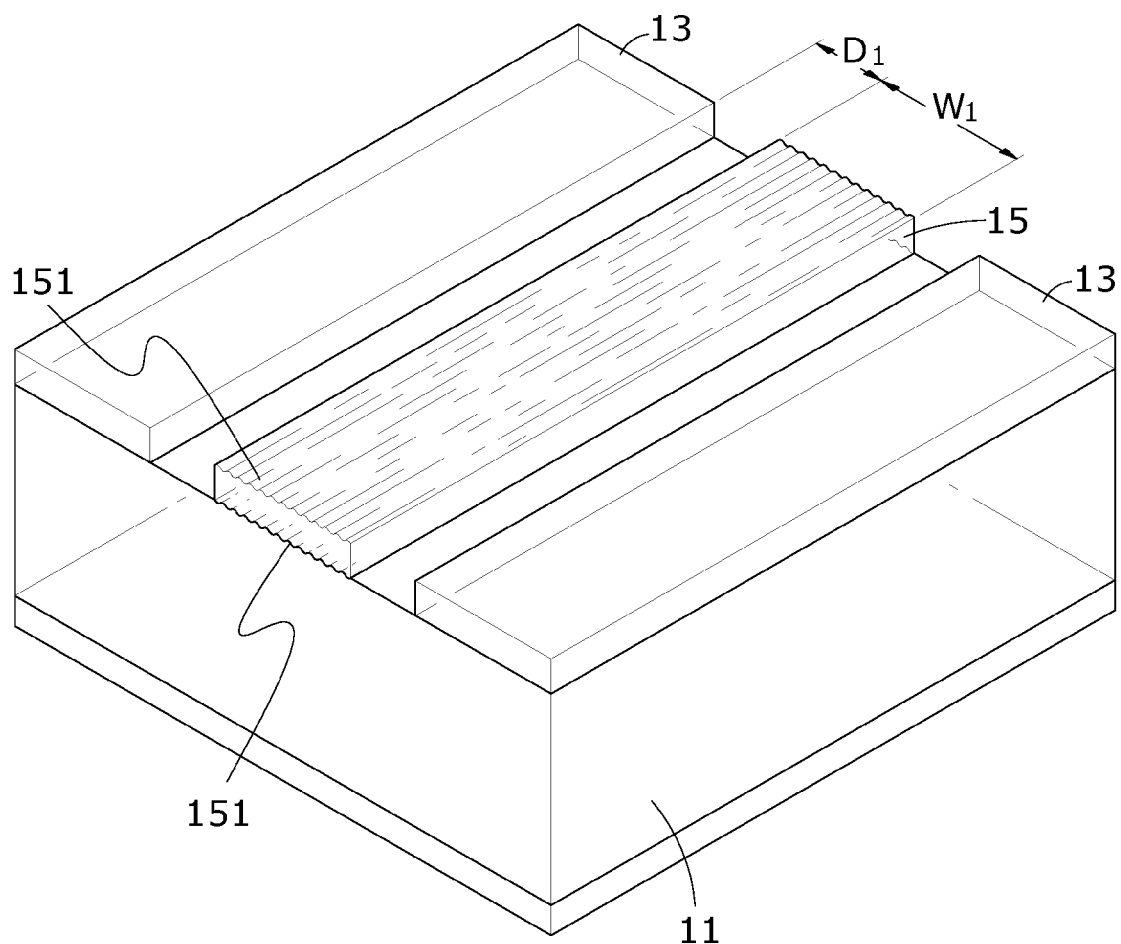
FIG. 1 is a schematic view of a first embodiment of a carrier for transmitting a high frequency signal according to the present invention.
Figure 2:
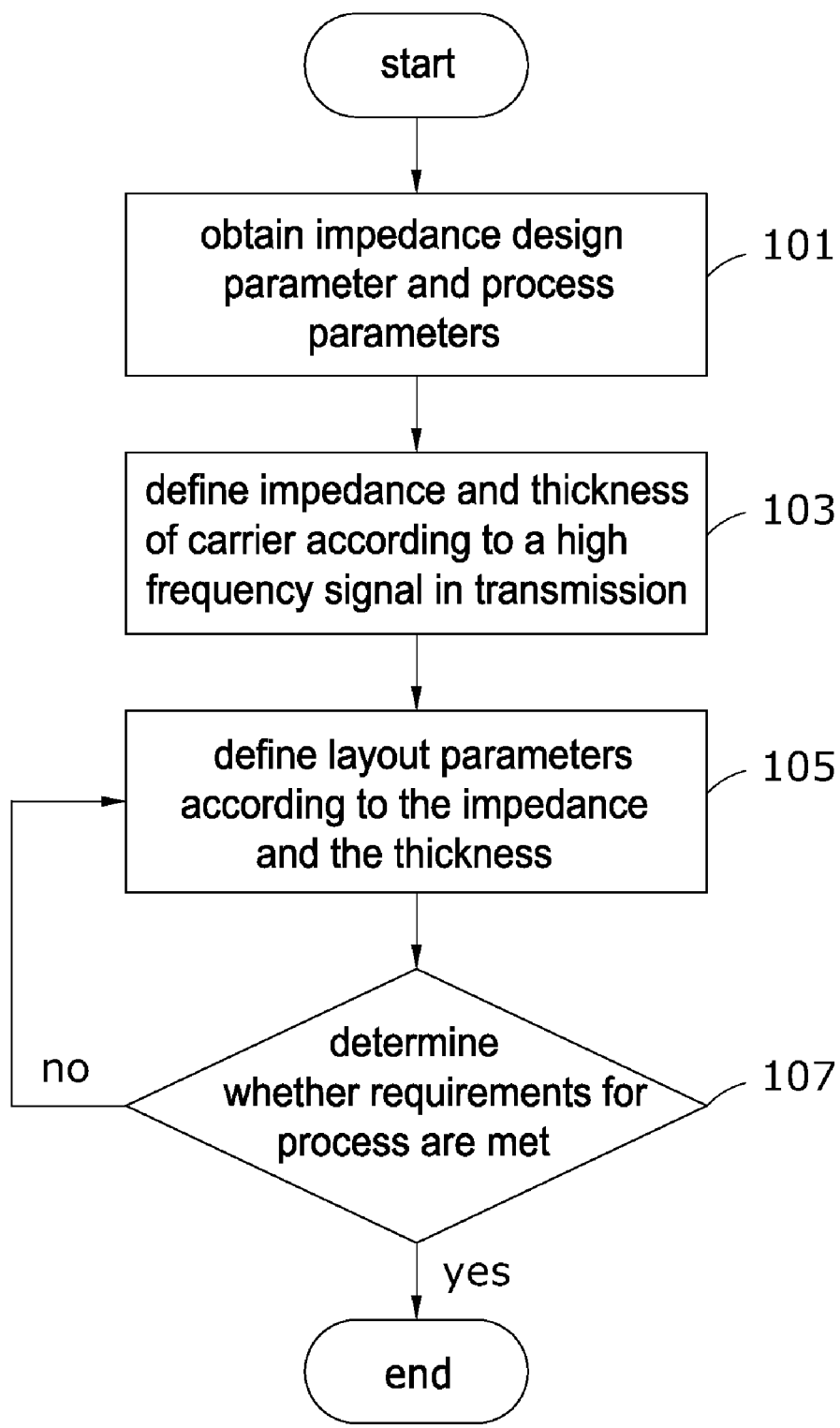
FIG. 2 is a flowchart of performing carrier layout according to the present invention.

Referring to FIG. 1 and FIG. 2, a schematic view of a first embodiment of a carrier for transmitting a high frequency signal and a flowchart of performing carrier layout according to the present invention are shown, respectively. As shown in FIG. 1, in the first embodiment, a carrier 1 comprises a substrate 11, reference planes 13 and conducting wires 15 both formed on the substrate 11. The reference planes 13 and the conducting wires 15 together function as a signal transmission structure.

It should be noted that, in the first embodiment and the other embodiments, the carrier 1 is a circuit board, a bus line, and a flexible circuit board for use with communication products. The flexible circuit board is a flexible printed circuit board (flexible PCB), a flex-rigid PCB, or an equivalent circuit board.

The substrate 11 is a substrate with-high loss tangent (tan $\delta$), such as an epoxy glass (FR4) substrate, or any other substrates with high loss tangent.

The reference planes 13 are formed on the substrate 11 and are power planes, ground planes, or other planes. In the first embodiment, the signal transmission structure comprises the reference planes 13 and the conducting wires 15. However, persons skilled in the art understand that the signal transmission structure is not limited to one described in the first embodiment.

The conducting wires 15 are formed on the substrate 11 and formed with roughness portions 151, and are of width $W_1$. In the first embodiment, the roughness portions 151 are formed on two sides of the conducting wires 15 to increase roughness of the conducting wires 15. This serves to reduce a material's ability to conduct electric current at high frequency and increase high frequency loss. In the other embodiments, the conducting wires 15 are formed on one of the two sides of the conducting wires 15.

In the first embodiment, a coplanar waveguide encompasses both the conducting wires 15 and the reference planes 13 as a part thereof in the same layer to reduce distance ($D_1$) between the conducting wires 15 and the reference planes 13. As high frequency loss increases with surface current density, the signal transmission structure works by increasing surface current density greatly.

Referring to FIG. 2, a flowchart of performing carrier layout according to the present invention is shown. The layout design begins from Step 101 (i.e. start). Step 101 involves obtaining impedance design parameters and process parameters. For example, the impedance design parameters include a dielectric constant (DK), dissipation factor (DF), board thickness, or any other impedance design parameters which are a concern from a circuit board manufacturer's perspective. For example, the process parameters include trace width, spacing, thickness of a layer of nickel, roughness, overall board thickness, or any other process parameters which are circuit board manufacturers' concerns. The process parameters comprise layout parameters.

Step 103 involves defining impedance and thickness of the carrier 1 according to the high frequency signal in transmission. In the present embodiment, the carrier 1 is configured for use with communication products, and the impedance and the thickness are determined according to requirements for communication products; meanwhile, board thickness required for layout design is evaluated when the carrier 1 is a circuit board.

Figure 3:
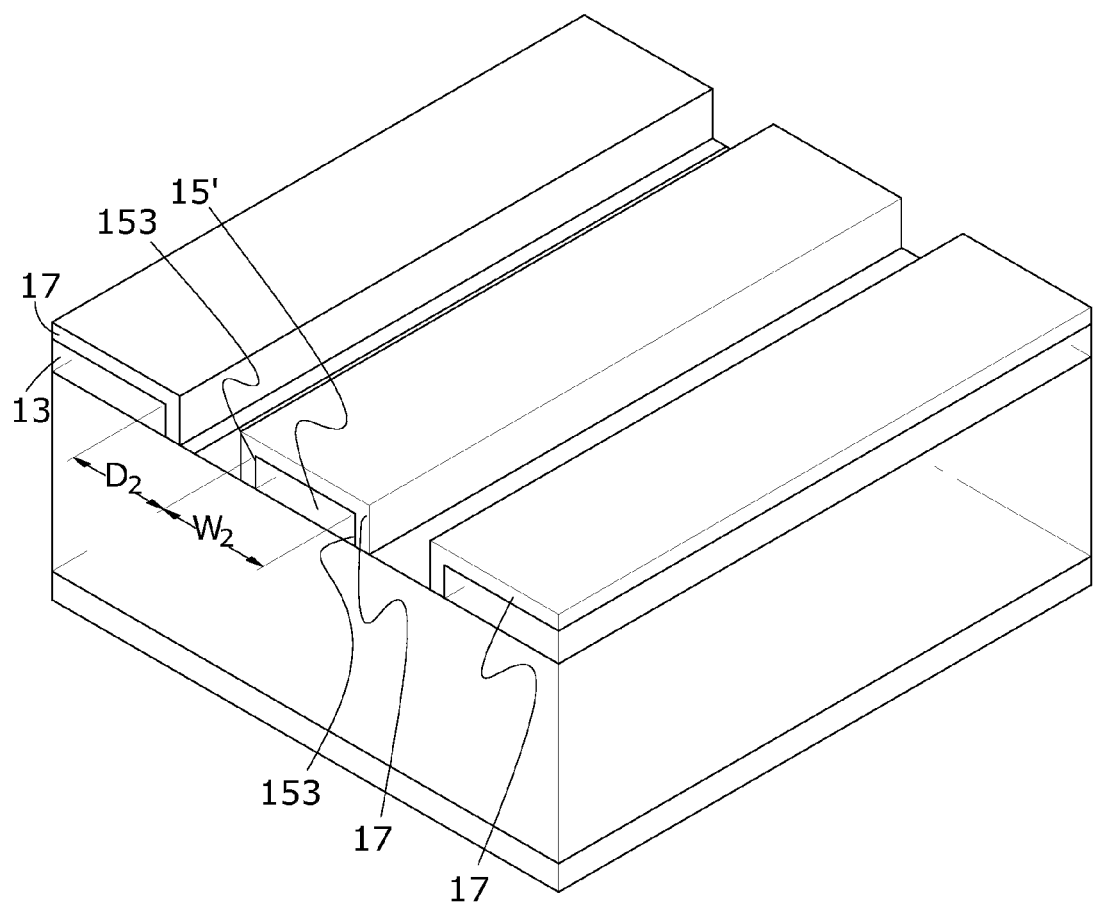
FIG. 3 is a schematic view of a second embodiment of a carrier for transmitting a high frequency signal according to the present invention.

Step 105 involves defining layout parameters according to the impedance and the thickness, so as to evaluate the layout parameters required for layout design. In the first embodiment, impedance calculation software is used in evaluation of the layout parameters required, which entails entering layout parameters, such as a trace width, spacing, dielectric constant (DK), height, or distance, to calculate impedance. The layout parameters comprise at least one of the following features: forming a conducting layer 17 on the conducting wires 15; the conducting layer 17 is a layer of nickel or a layer of metal of low electrical conductivity as depicted in FIG. 3; forming a coplanar waveguide to encompass both the reference planes 13 and the conducting wires 15 as a part thereof as depicted in FIG. 1; forming roughness portions 151 on the conducting wires 15; forming recessed portions on the conducting wires 15 (to be described later) as depicted in FIG. 1, the recessed portions are formed om at least one side of the conducting wires 15 so as to reduce cross-sectional area of a current path with a view to increasing high frequency loss; and the substrate 11 is a high loss tangent substrate for increasing high frequency signal loss.

The step of defining layout parameters according to the impedance and the thickness is applicable to the following equations:

$$\sigma_c = \sigma/Kw^2 \qquad (1)$$

wherein electrical conductivity of roughness portion is denoted by $\sigma_c$, electrical conductivity is denoted by $\sigma$ and skin effect parameter is denoted by Kw.

$$Kw = 1 + \exp((-(s/2h)^{1.6}))$$

wherein roughness is denoted by h and skin depth by s.

$$\text{unit loss } (R) = \sigma_c/(w \times s) \qquad (2)$$

Wherein electrical conductivity of the roughness portion is denoted by $\sigma_c$, trace width by w, and cross-sectional area by w×s.

$$s = (\pi \times f \times u \times \sigma_c)^{(-1/2)} \qquad (3)$$

wherein frequency is denoted by f and permeability by u.

$$V = IR \qquad (4)$$

wherein voltage is denoted by V, current by I, and resistance by R; wherein high frequency loss increases with surface current density.

$$\gamma = j\omega(\mu\epsilon'(1-j\tan\delta))^{1/2} \qquad (5)$$

wherein tan δ denotes loss tangent, and high frequency loss increases with loss tangent. γ denotes frequency loss, ω denotes angular frequency, μ denotes permeability, ε' denotes lossless permittivity.

In the first embodiment, roughness of the conducting wires 15 is augmented by equations (1), (2), and (3), and layout is performed according to the layout parameters defined so as to increase loss of the high frequency signal. Persons skilled in the art understand: because of the influence of Skin Effect, the higher the frequency of a signal, the more likely the resultant current concentrates on the surface of the conducting wires; roughness of the surface of the conducting wires has the same effect as impedance; and, given carriers made of the same material, signal loss increases with signal frequency, and the correlation increases with roughness of the conducting wires conveying the current.

Step 107 involves determining whether the layout parameters meet requirements for the process. If the layout parameters meet requirements for the process (i.e. yes), layout design will terminate (i.e. end). If the layout parameters do not meet requirements for the process (i.e. no), go back to step 105 to, once again, evaluate the layout parameters required for layout design. After the layout parameters have been defined according to the impedance and the thickness, layout is carried out according to the layout parameters defined, so as to increase loss of the high frequency signal in transmission.

In the first embodiment as depicted in FIG. 1, the carrier layout method involves forming the signal transmission structure on the substrate 11 first. The signal transmission structure comprises the reference planes 13 and the conducting wires 15. The conducting wires 15 are formed with the roughness portions 151 thereon. With both the reference planes 13 and the conducting wires 15 lying on the same layer, a coplanar waveguide encompassess both the reference planes 13 and the conducting wires 15 as a part thereof; that is to say, in the first embodiment, surface current density is increased by equations (4) so as to increase high frequency loss, and loss tangent is increased by equation (5) so as to further increase high frequency loss. Although the roughness portions 151, the coplanar waveguide, and the signal transmission structure that features high loss tangent are provided in the first embodiment, one or more of them are provided in the other embodiments, and thus the present invention is not limited by the embodiments.

Figure 4:
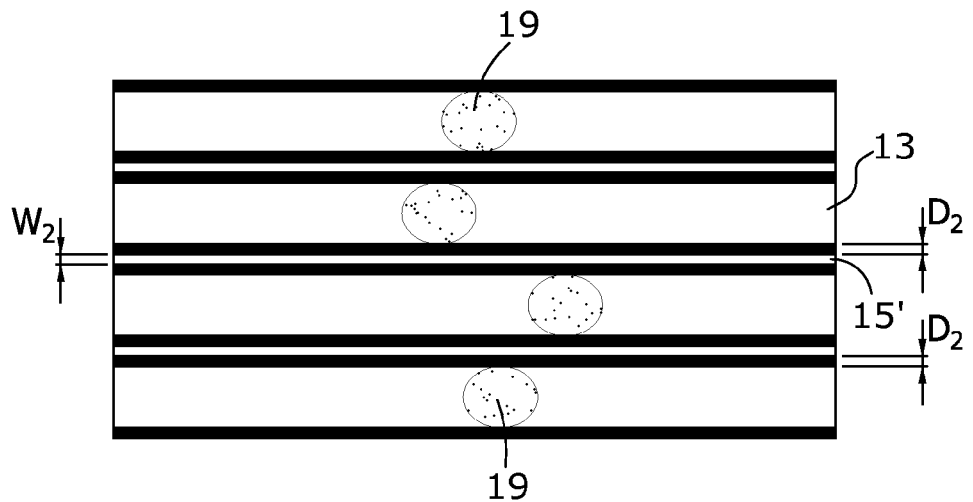
FIG. 4 is a schematic view of a layout in FIG. 3.

Referring to FIG. 3 and FIG. 4, schematic views of a second embodiment of a carrier for transmitting a high frequency signal according to the present invention are shown. In the first and second embodiments, like or similar elements are denoted alike, using like or similar reference numerals. Descriptions of the first embodiment are not repeated in the second embodiment in detail.

Findings of a comparison between the first embodiment (as shown in FIG. 1) and the second embodiment (as shown in FIG. 3) are described hereunder. In the first embodiment, there is distance $D_1$ between the conducting wires 15 and the reference planes 13 lying on the same layer (in other words, the conducting wires 15 are spaced apart from the reference planes 13 by distance $D_1$), and the conducting wires 15 are of width $W_1$. By contrast, in the second embodiment, there is distance $D_2$ between the conducting wires 15' and the reference planes 13, and the conducting wires 15' are of width $W_2$. Distance $D_1$ is (FIG. 1) is less than distance $D_2$. Width $W_1$ (FIG. 1) is greater than width $W_2$.

Referring to FIG. 3, the conducting wires 15' are selectively formed with recessed portions 153 thereon. In the second embodiment, the recessed portions 153 are formed on two opposing sides of the conducting wires 15', and more particularly, on the conducting wires 15' widthwise; hence, width $W_1$ of the conducting wires 15 in the first embodiment as depicted in FIG. 1 is greater than width $W_2$ of the conducting wires 15' in the second embodiment as depeicted in FIGS. 3 & 4. However, in the other embodiments, the recessed portions 153 can be formed on any side of the conducting wires 15', that is, whether widthwise or in the thickness direction, and in consequence both width $W_1$ and thickness of the conducting wires 15 are greater than width $W_2$ and thickness of the conducting wires 15'. Hence, in the second embodiment, width and/or thickness of the conducting wires are reduced by equation (3); in other words, the second embodiment will be applicable, provided that the recessed portions 153 are formed on at least one side of the conducting wires 15' so as to reduce cross-sectional area of a current path with a view to increasing high frequency loss.

The carrier layout method further comprises a step of performing surface treatment; for example, forming the conducting layer 17 on the conducting wires 15'. In the second embodiment, a material, such as nickel, is plated to the conducting wires 15' and the reference planes 13 by electroplating or sputtering so as for the conducting wires 15' and the reference planes 13 to be fully covered with the conducting layer 17, with two distinguishing technical features: the conducting layer 17 thus formed does not exist in between the conducting wires 15' and the reference planes 13; and the conducting layer 17 thus formed appears in the form of a layer of nickel. Alternatively, the conducting layer 17 is made of another material of relatively low electrical conductivity, such as aluminum, or any material of low electrical conductivity. Alternatively, the conducting layer 17 is made of an alloy instead of a single elemental metal by any existing process, that is, not in any way limited by the second embodiment. To increase thickness of the conducting layer 17, Electroless Nickel and Immersion Gold (ENIG) is performed, thereby protecting the surface of the carrier and dispensing with solder mask dispensing otherwise required later.

Referring to FIG. 4, which is a schematic view of a layout in FIG. 3, the conducting wires 15' have trace width denoted by width $W_2$ and spacing denoted by distance $D_2$, and a plurality of through holes 19 are formed in the reference planes 13. However, persons skilled in the art understand the positions of the through holes 19 are not limited by the second embodiment.

Figure 5:
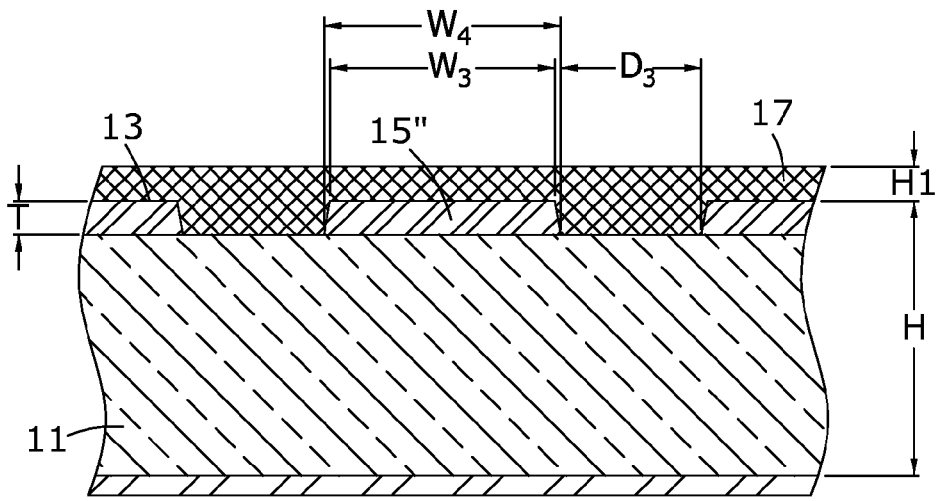
FIG. 5 is a schematic view of a variant embodiment of a carrier for transmitting a high frequency signal according to the present invention.

Of course, the present invention is always open to variation. For instance, a combination of at least one of the layout parameters can be provided. Referring to FIG. 5, the conducting layer 17 covers conducting wires 15", the reference planes 13, and the substrate 11 in a continuous manner. Also, the drawing shows the following: the substrate 11 is of height H; there is distance $D_3$ between the reference planes 13 and the conducting wires 15"; the conducting wires 15" are of thickness T and are trapezoid-shaped, as the upper side and the lower side of the conducting wires 15" are of width $W_3$ and width $W_4$, respectively, wherein width $W_3$ is less than width $W_4$ to form the recessed portions on two opposing sides of the conducting wires 15'; and the conducting layer 17 is of height $H_1$. Distance $D_3$ is selectively less than the aforesaid distance $D_1$ (FIG. 1) and distance $D_2$ (FIGS. 3 & 4).

Hence, during the process, after the height H, height $H_1$, distance $D_3$ (distance $D_1$ and distance $D_2$), thickness T, width $W_3$ (width $W_1$, width $W_2$, and width $W_4$), and dielectric constant have been defined and the impedance has been estimated, the impedance calculation software is ready for use in evaluation of the layout parameters required. Thickness T also correlates with cross-sectional area, and the correlation is expressed by cross-sectional area equation $w \times T-(w-2s)(T-2s)=2s(w+T)-4s^2$, wherein s denotes skin depth.

For instance, as revealed by the table below, data shown in the table can be obtained by analysis software, such as a statistics package.

| Distance $D_1$ (mils) | Thickness of Conducting Layer ($H_1$) | Transmission Loss at 900 MHz (dB) | Electric Field (E-Field) at 900 MHz (dB) |
|---|---|---|---|
| 2.4 | 0.15 | −1.01 | 2.0141 |
| 3 | 0.0 | −0.28 | 3.8875 |
| 3 | 0.1 | −0.84 | 3.6922 |
| 3 | 0.2 | −0.88 | 3.2305 |
| 4.5 | 0.08 | −0.63 | 5.0483 |
| 4.5 | 0.15 | −0.68 | 5.3633 |
| 4.5 | 0.22 | −0.72 | 5.0638 |
| 6 | 0.0 | −0.31 | 6.5087 |
| 6 | 0.1 | −0.62 | 6.0139 |
| 6 | 0.2 | −0.69 | 6.8932 |
| 6.6 | 0.15 | −0.65 | 7.0628 |

According to the table above, in the presence of the embodiment of the conducting layer 17 formed (by plating nickel or other metals of low electrical conductivity), reduction in distance (i.e., distance $D_1$) between conducting wire and ground on the same layer always increases transmission loss greatly, without adding to radiation generated by the signal transmission. Given a distance of 3, increasing thickness $H_1$ of the conducting layer 17 from 0.1 mils to 0.2 mils does not increase transmission loss significantly; instead, transmission loss increases markedly only when a short distance is in use.

Hence, in the aforesaid embodiment, high frequency loss can be increased, provided that the signal transmission structure is devised by means of at least one of the foregoing equations (layout parameters); alternatively, a combination of at least one of the equations works well too, and thus the present invention is not to be limited by the embodiments described herein. For example, surface treatment can be carried out to increase thickness of the conducting layer (as high frequency loss can be increased by using a conducting layer of low electrical conductivity) and decrease width and thickness of the conducting wires (as high frequency loss can be increased by reducing the cross-sectional area of a current path). Alternatively, high frequency loss can be increased by simultaneously providing a coplanar waveguide (for reducing the distance between the conducting wires and the reference planes on the same layer) and decreasing the width and thickness of the conducting wires (as high frequency loss can be increased by reducing the cross-sectional area of a current path). The aforesaid changes are comprehensible to and accomplishable by persons skilled in the art, and thus corresponding drawings and related descriptions are omitted herein.

The foregoing embodiments serve to illustrate principles and effects of the present invention rather than impose limitations upon the present invention. Persons skilled in the art can modify or change the embodiments without going against the spirit and scope of the present invention. Hence, all equivalent modifications or changes carried out to the embodiments by persons skilled in the art without departing from the spirit and technical notions of the present invention still are deemed ones that fall within the scope of disclosure of the present invention as defined by the claims presented hereunder.

What is claimed is:

1. A carrier for transmitting a high frequency signal, comprising a substrate, conducting wires and reference planes both formed on the substrate, and characterized by at least one of a conducting layer formed on the conducting wires, a coplanar waveguide that encompasses both the reference planes and the conducting wires as a part thereof, roughness portions formed on the conducting wires, recessed portions forming on the conducting wires, and the substrate being a high loss tangent substrate for increasing high frequency signal loss wherein the roughness portions satisfy equations $\sigma_c=\sigma/Kw^2$ and $Kw=1+\exp(-(s/2h)^{1.6})$, wherein electrical conductivity is denoted by $\sigma$, skin effect parameter is denoted by Kw, roughness by h, skin depth by s, and electrical conductivity of roughness portion by $\sigma_c$.

2. The carrier of claim 1, wherein the conducting layer is a layer of nickel.

3. The carrier of claim 1, wherein the roughness portions are provided on at least a side of the conducting wires.

4. The carrier of claim 1, wherein the carrier is one selected from the group consisting of a circuit board, a bus line, and a flexible circuit board.

5. The carrier of claim 1, wherein the recessed portions satisfy the equation $s=(\pi \times f \times u \times \sigma_c)^{(-1/2)}$, wherein frequency is denoted by f and permeability by u.

6. The carrier of claim 1, wherein unit loss (R) of the signal in a circuit board satisfies equation $R=\sigma_c/(w \times s)$, wherein electrical conductivity of said roughness portion is denoted by $\sigma_c$, trace width by w, and cross-sectional area by $(w \times s)$.

7. The carrier of claim 1, wherein the conducting wires are of a thickness (T), the thickness satisfying cross-sectional area equation $w \times T-(w-2s)(T-2s)=2s(w+T)-4s^2$, wherein trace width is denoted by w.

8. The carrier of claim 1, wherein the recessed portions are formed on at least a side of the conducting wires.

9. The carrier of claim 1, wherein the substrate is an organic fiberglass (FR4) substrate.

10. A carrier layout method of transmitting a high frequency signal, comprising steps of:
- defining impedance and thickness of a carrier according to the high frequency signal being transmitted;
- defining layout parameters according to the impedance and the thickness, wherein the carrier comprises a substrate, conducting wires and reference planes both formed on the substrate, and the layout parameters are characterized by at least one of forming a conducting layer on the conducting wires, forming a coplanar waveguide to encompass both the reference planes and the conducting wires, forming roughness portions on the conducting wires, forming recessed portions on the conducting wires, and the substrate being a high loss tangent substrate; and
- performing layout according to the layout parameters defined, so as to increase loss of the high frequency signal being transmitted;
- wherein the roughness portions satisfy equations $\sigma_c = \sigma/Kw^2$ and $Kw = 1+\exp(-(s/2h)^{1.6})$, wherein electrical conductivity is denoted by $\sigma$, skin effect parameter is denoted by Kw, roughness by h, skin depth by s, and electrical conductivity of roughness portion by $\sigma_c$.

11. The method of claim 10, wherein the conducting wires are of a thickness (T), the thickness satisfying cross-sectional area equation $w \times T - (w-2s)(T-2s) = 2s(w+T) - 4s^2$, wherein trace width is denoted by w.

12. The method of claim 10, wherein the carrier is one selected from the group consisting of a circuit board, a bus line, and a flexible circuit board.

13. The method of claim 12, wherein, in the step of defining layout parameters according to the impedance and the thickness, the carrier is a circuit board, and the step of defining layout parameters further comprises evaluating board thickness required for layout design.

14. The method of claim 10, further comprising a step of performing surface treatment for forming the conducting layer on the conducting wires.

15. The method of claim 14, wherein the surface treatment is performed by one of electroplating and sputtering.

16. The method of claim 10, wherein Electroless Nickel and Immersion Gold (ENIG) is performed so as to increase thickness of the conducting layer.

17. The method of claim 10, wherein unit loss (R) of the signal transmitted by the carrier satisfies equation $R = \sigma_c/(w \times s)$, wherein electrical conductivity of said roughness portion is denoted by $\sigma_c$, trace width by w, and cross-sectional area by $w \times s$.

18. The method of claim 10, wherein the recessed portions satisfy the equation $s = (\pi \times f \times u \times \sigma_c)^{(-1/2)}$, wherein frequency is denoted by f and permeability by u.

* * * * *